United States Patent
Gwinn et al.

(10) Patent No.: US 7,642,531 B2
(45) Date of Patent: Jan. 5, 2010

(54) APPARATUS AND METHOD FOR REDUCING PARTICULATE CONTAMINATION IN GAS CLUSTER ION BEAM PROCESSING EQUIPMENT

(75) Inventors: Matthew C. Gwinn, Winchendon, MA (US); Martin D. Tabat, Nashua, NH (US)

(73) Assignee: TEL Epion Inc., Billerica, MA (US)

( * ) Notice: Subject to any disclaimer, the term of this patent is extended or adjusted under 35 U.S.C. 154(b) by 336 days.

(21) Appl. No.: 11/775,494

(22) Filed: Jul. 10, 2007

(65) Prior Publication Data

US 2008/0048132 A1    Feb. 28, 2008

Related U.S. Application Data

(60) Provisional application No. 60/831,100, filed on Jul. 14, 2006.

(51) Int. Cl.
*H01J 37/09* (2006.01)
*H01J 37/317* (2006.01)

(52) U.S. Cl. ............................. 250/492.21; 250/492.3
(58) Field of Classification Search .................. None
See application file for complete search history.

(56) References Cited

U.S. PATENT DOCUMENTS

| | | | |
|---|---|---|---|
| 4,559,096 A * | 12/1985 | Friedman et al. | 156/272.2 |
| 4,760,253 A * | 7/1988 | Hutton | 250/288 |
| 5,814,194 A | 9/1998 | Deguchi et al. | |
| 6,416,820 B1 | 7/2002 | Yamada et al. | |
| 6,635,883 B2 | 10/2003 | Torti et al. | |
| 6,646,277 B2 | 11/2003 | Mack et al. | |
| 7,009,176 B2 * | 3/2006 | Thakur | 250/288 |
| 2009/0108197 A1 * | 4/2009 | Alcott et al. | 250/287 |

* cited by examiner

*Primary Examiner*—Jack I Berman
(74) *Attorney, Agent, or Firm*—Wood, Herron & Evans LLP

(57) ABSTRACT

Beam-defining apparatus and methods for defining a gas cluster ion beam used to process a workpiece. The beam-defining apparatus includes a second member projecting from a first member in a direction away from the workpiece and an aperture defined in the first and second members that is configured to transmit at least a portion of the gas cluster ion beam to the workpiece.

23 Claims, 5 Drawing Sheets

APPARATUS AND METHOD FOR REDUCING PARTICULATE CONTAMINATION IN GAS CLUSTER ION BEAM PROCESSING EQUIPMENT

CROSS-REFERENCE TO RELATED APPLICATIONS

This application claims the benefit of U.S. Provisional Application No. 60/831,100, filed Jul. 14, 2006, the disclosure of which is hereby incorporated by reference herein in its entirety.

TECHNICAL FIELD

The invention relates generally to gas cluster ion beam (GCIB) apparatus and methods for processing the surface of a workpiece and, in particular, to methods and apparatus for reducing workpiece contamination in a high current GCIB processing tool.

BACKGROUND OF THE INVENTION

Gas cluster ion beams (GCIBs) have been used for etching, cleaning, and smoothing surfaces on workpieces, and for assisting the deposition of films from vaporized carbonaceous materials, and for depositing and/or infusing dopants, semiconductor materials, and other materials. For purposes of this discussion, gas clusters are considered nano-sized aggregates of materials that are gaseous under conditions of standard temperature and pressure. Such gas clusters may consist of aggregates of from a few molecules to several thousand molecules or more that are loosely bound to form a cluster.

The gas clusters can be ionized by electron bombardment, permitting them to be formed into directed beams of controllable energy. Such ions each typically carry positive charges given by the product of q·e (where e is the magnitude of the electronic charge and q is a positive integer having a value of from one to several, representing the charge state of the cluster ion). The larger sized cluster-ions are often the most useful because of their ability to carry substantial energy per cluster-ion, while yet having only modest energy per molecule. The clusters disintegrate on impact, with each individual molecule carrying only a small fraction of the total cluster energy. Consequently, the impact effects of large clusters are substantial, but are limited to a very shallow surface region. This makes gas cluster ions effective for a variety of surface modification processes, without the tendency to produce deeper subsurface damage, which is characteristic of conventional ion beam processing.

Presently available cluster-ion sources produce cluster-ions having a wide distribution of sizes, N, up to N of several thousand (where N=the number of molecules in each cluster). In the case of monatomic gases like argon, an atom of the monatomic gas will be referred to as either an atom or a molecule and an ionized atom of such a monatomic gas will be referred to as either an ionized atom, a molecular ion, or a monomer ion. Because of their low mass, molecular ions and/or monomer ions and other very light ions in an accelerated GCIB are often considered undesirable, because when accelerated through an electrical potential difference they acquire much higher velocities than the larger cluster ions. When used to process a workpiece surface, such high velocity monomer ions tend to penetrate the surface much more deeply than the larger clusters and produce unwanted sub-surface damage, detrimental to the desired process.

Accordingly, it has been common practice to incorporate a monomer beam filter in GCIB processing equipment. Such a filter typically uses a magnetic field applied by a (preferably permanent) magnet to the beam to deflect the monomer ions and other low mass ions out of the main GCIB to eliminate their undesired effects on the GCIB process. The monomer and other low mass ions are typically analyzed out of the main GCIB using a downstream aperture that intercepts the deflected light ions, while allowing the heavier ions (which are essentially undeflected) to pass to the workpiece. Commonly-assigned U.S. Pat. No. 6,635,883 to Torti et al. teaches the use of a magnet and aperture for removing monomer and low-mass cluster ions and is incorporated by reference herein in its entirety.

A current measuring device, as for example a Faraday cup, is typically used in GCIB processing equipment to measure the dose of GCIB applied during processing and/or to control the amount of GCIB dose delivered to a workpiece. Such a current measuring device often has an entrance aperture for accepting the beam to be measured. Occasionally, the envelope of a GCIB is ill defined and may tend to fluctuate slightly, so it is useful and desirable to use a beam defining aperture to cleanly define the shape and/or extent of a GCIB prior to current measurement with a Faraday cup. Such a defining aperture assures that the GCIB measured and the GCIB utilized in workpiece processing are the same in extent and that the entire beam used in processing is accepted for measurement by the Faraday cup or other current measuring means, for precise process dosimetry purposes. Commonly-assigned U.S. Pat. No. 6,646,277 to Mack et al. teaches the use of a defining aperture for beam definition prior to workpiece and/or the dosimetry Faraday cup, and is incorporated by reference herein in its entirety.

Many useful surface-processing effects can be achieved by bombarding surfaces with GCIBs. These processing effects include, but are not limited to, smoothing, etching, film growth/deposition, and infusion of materials into surfaces. In many cases, it is found that in order to achieve industrially practical throughputs in such processes, GCIB currents on the order of hundreds or, perhaps, thousands of microamperes are required to supply the necessary surface processing doses. In general the processing effects tend to increase with increasing GCIB current and/or dose.

Several emerging applications for GCIB processing of workpieces on an industrial scale are in the semiconductor field and in other high technology fields. Due to yield and performance considerations, such applications typically require that processing steps contribute only very low levels of contamination. Although GCIB processing of workpieces is done using a wide variety of gas cluster source gases, many of which are inert gases, in many GCIB processing applications it is desirable to use GCIBs comprising reactive source gases and source gases that can be used to deposit metals, ceramics, semiconductor, and other films, sometimes in combination or mixture with inert or noble gases.

Often halogen-containing gases, oxygen, metals-containing gases, semiconductor-materials-containing gases and other reactive gases or mixtures thereof are incorporated into GCIBs, sometimes in combination or mixture with inert or noble gases. These gases pose a problem for gas cluster ionizer design for semiconductor processing because of their corrosive nature, because they result in etching, sputtering, or deposition of films on impacted surfaces. Often such etching, sputtering, or deposition is part of the intended and desired workpiece processing.

However, apertures such as those used for beam definition and for separating molecular, monomer, and low-mass ions from the processing beam also are irradiated by the GCIB. After extended processing periods involving the processing of many workpieces, the apertures can acquire huge GCIB doses. Such incidental dosing of the apertures can result in formation of contamination of the aperture surfaces due to sputtering, corrosion, and deposition of GCIB components or materials sputtered and/or chemically etched from other surfaces due to GCIB incidence effects. The contaminating materials accumulate on the aperture surfaces, often in the form of poorly-adhered films or accumulations.

Normal thermal cycling, vibrations, or other effects can cause the release of particles of the contaminants from the aperture surfaces. The proximity of such apertures to the workpiece and/or transport of the particles by electrostatic transport effects or other effects can result in very undesirable transport of contaminating particles to the workpiece(s) being processed in the GCIB equipment resulting in spoiled product or low product yields.

With reference to FIGS. 1A and 1B, a conventional beam-defining apparatus 10 for a GCIB processing tool includes an aperture plate 12 and an aperture 14 extending through the aperture plate 12. Aperture plate 12 is supported, held in alignment, electrically grounded and thermally heat sunk by aperture plate support (not shown). Aperture plate 12, which is typically electrically conductive, has a front surface 16 that is struck by a GCIB 20 traveling in the direction of axis 18. The aperture 14 defines the beam and analyzes the beamlet traveling along axis 18, so that monomer, molecular and/or low mass cluster ions are eliminated from the GCIB 20 and only a collimated or filtered portion 19 is transmitted for irradiating and processing a workpiece 22 and for purposes of dosimetry. The aperture 14 has a round cross-sectional profile and is generally disposed within the plane of the aperture plate 12 between the front and rear surfaces 16, 17 of the aperture plate 12.

A portion of the GCIB 20 is intercepted by the front surface 16 of the aperture plate 12 at a roughly annular region 24 surrounding the aperture 14. The angle of incidence is approximately normal to the plane of the front surface 16 of aperture plate 12. After prolonged use, and as a result of sputtering, etching, and/or deposition, contaminants 26 accumulate on the annular region 24 on the front surface 16. Eventually, some of the contaminants 26 may be shed from the front surface 16 in the form of particles that may be transported to the workpiece 22 causing undesirable particulate contamination of workpiece 22. Particles shed from the aperture plate 12 are predominately shed into the GCIB 20 where electrostatic forces and other beam forces facilitate transport to the workpiece 22.

What is needed, therefore, is a beam-defining apparatus for a GCIB processing tool that includes an aperture constructed to reduce the release of contaminant particles of from surfaces near the aperture.

SUMMARY OF THE INVENTION

A beam-defining apparatus is provided for defining a gas cluster ion beam used to process a workpiece. In one embodiment, the beam-defining apparatus comprises a first member adapted to be supported in a spaced relationship with the workpiece and a second member projecting from the first member in a direction away from the workpiece. The first and second members include an aperture configured to transmit at least a portion of the gas cluster ion beam to the workpiece.

The beam-defining apparatus may be used in conjunction with a gas cluster ion beam apparatus for processing a workpiece with a gas cluster ion beam. The gas cluster ion beam apparatus comprises a vacuum vessel and a gas cluster ion beam source within the vacuum vessel. The gas cluster ion beam source configured to produce the gas cluster ion beam. The beam-defining apparatus is disposed in the vacuum vessel between the gas cluster ion beam source and the workpiece.

In another embodiment, a method is provided for processing a workpiece with a gas cluster ion beam. The method comprises directing the gas cluster ion beam through an inlet opening to a beam-defining aperture and orienting a surface surrounding the beam-defining aperture relative to a travel direction of the gas cluster ion beam so that the surface is inclined relative to the travel direction. The method further comprises impinging the surface with the gas cluster ion beam to reduce a cross-sectional area of the gas cluster ion beam transmitted through the beam-defining aperture and exposing the workpiece to the gas cluster ion beam after the gas cluster ion beam exits an outlet opening of the beam-defining aperture.

DETAILED DESCRIPTION

Figure 2:
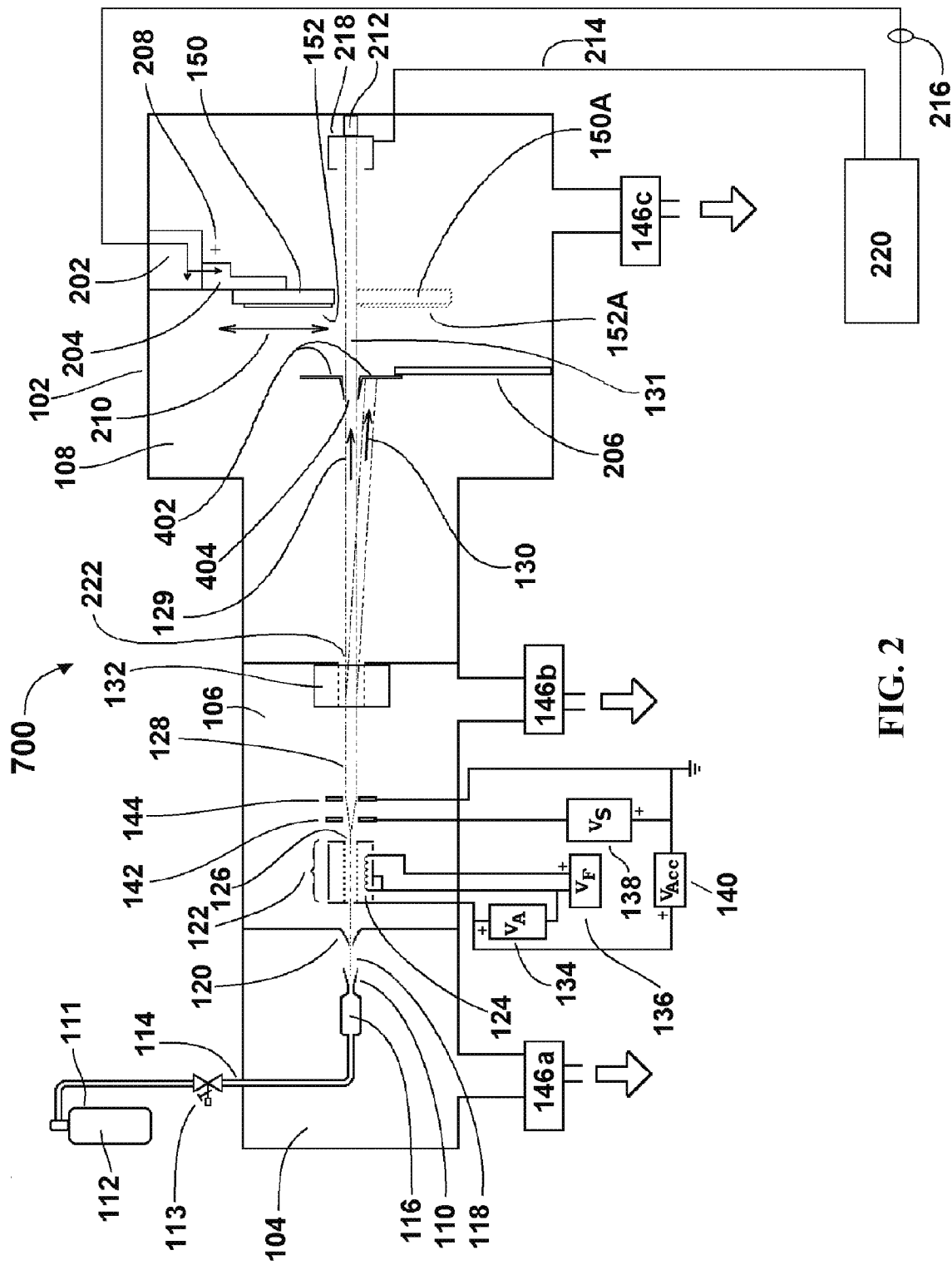
FIG. 2 is a schematic view of a GCIB processing apparatus incorporating a GCIB beam-defining apparatus in accordance with an embodiment of the invention.

With reference to FIG. 2, a GCIB processing apparatus 100 includes a vacuum vessel 102 is divided into three communicating chambers, a source chamber 104, an ionization/acceleration chamber 106, and a processing chamber 108. The three chambers are evacuated to suitable operating pressures by vacuum pumping systems 146a, 146b, and 146c, respectively.

A condensable source gas 112, which is stored in a gas storage cylinder 111 is admitted under pressure through gas metering valve 113 and gas feed tube 114 into stagnation chamber 116 and is ejected into the substantially lower pressure vacuum through a properly shaped nozzle 110. A supersonic gas jet 118 results. Cooling, which results from the expansion in the gas jet 118, causes a portion of the gas jet 118 to condense into clusters, each consisting of from several to several thousand weakly bound atoms or molecules. A gas skimmer aperture 120 partially separates the gas molecules that have failed to condensed into a cluster jet from the cluster jet so as to minimize pressure in the downstream regions where such higher pressures would be detrimental (e.g., ionizer 122, suppressor electrode 142, and processing chamber 108). Suitable condensable source gases 112 include, but are not limited to argon, nitrogen, carbon dioxide, oxygen, $NF_3$, $GeH_4$, $B_2H_6$, and other gases and/or gas mixtures.

After the supersonic gas jet 118 containing gas clusters has been formed, the clusters are ionized in an ionizer 122. The ionizer 122 is typically an electron impact ionizer that produces thermoelectrons from one or more incandescent filaments 124 and accelerates and directs the electrons, causing them to collide with the gas clusters in the gas jet 118 where the jet passes through the ionizer 122. The electron impacts with clusters eject electrons from the clusters, causing a portion the clusters to become positively ionized. Some clusters may have more than one electron ejected and may become multiply ionized.

Suppressor electrode 142, and grounded electrode 144 extract the cluster ions from the ionizer exit aperture 126, accelerate them to a desired energy (typically with acceleration potentials of from several hundred V to several tens of kV), and focuses them to form a gas cluster ion beam (GCIB) 128. The axis 129 of the supersonic gas jet 118 containing gas clusters is substantially the same as the axis of the GCIB 128. Filament power supply 136 provides filament voltage $V_f$ to heat the ionizer filament 124. Anode power supply 134 provides anode voltage $V_A$ to accelerate thermoelectrons emitted from filament 124 to cause the thermoelectrons to bombard the cluster-containing gas jet 118 to produce cluster ions. Suppression power supply 138 provides suppression voltage $V_S$ to bias suppressor electrode 142. Accelerator power supply 140 provides acceleration voltage $V_{Acc}$ to bias the ionizer 122 with respect to suppressor electrode 142 and grounded electrode 144 so as to result in a total GCIB acceleration potential equal to $V_{Acc}$. Suppressor electrode 142 serves to extract ions from the ionizer exit aperture 126 of ionizer 122, to prevent undesired electrons from entering the ionizer 122 from downstream, and to form a focused GCIB 128.

A magnet 132, which may have the construction of a permanent magnet, has a clear aperture 222 to allow GCIB passage and applies a magnetic field in a direction transverse to the travel direction of the GCIB 128 along axis 128. The magnetic field of the magnet 132 deflects the monomer ions, molecular ions, and perhaps some other of the lighter ions in the GCIB 128 forming a beamlet of undesired monomer, molecular and other low-mass ions traveling in a direction 130 slightly deflected from axis 129 and separating the undesired monomer, molecular and/or other low-mass ions from the heavier and larger cluster ions traveling in GCIB 128 along axis 129.

A filtered GCIB 131 consists of the high-mass essentially undeflected portion of GCIB 128 and passes through an aperture 404 in an aperture plate 402 of a beam-defining apparatus 400. Aperture plate 402 defines the beam and analyzes the beamlet traveling in direction 130, so that monomer, molecular and/or low mass cluster ions are eliminated from the GCIB and only the filtered GCIB 131 is passed for workpiece processing and for dosimetry. Aperture plate 402 is typically electrically conductive. Aperture plate 402 is supported, held in alignment, electrically grounded, and thermally heat sunk by aperture plate support 206.

A workpiece 152, which may be a semiconductor wafer or other workpiece to be processed by GCIB processing, is held on a workpiece holder 150, which can be disposed in the path of the filtered GCIB 131. Since most applications contemplate the processing of large workpieces with spatially uniform results, a scanning system is desirable to uniformly scan a large-area workpiece 152 through the stationary filtered GCIB 131 to produce spatially homogeneous workpiece processing results.

An X-scan actuator 202 provides linear motion of the workpiece holder 150 in the direction of X-scan motion 208 (into and out of the plane of the paper). A Y-scan actuator 204 provides linear motion of the workpiece holder 150 in the direction of Y-scan motion 210, which is typically orthogonal to the X-scan motion 208. The combination of X-scanning and Y-scanning motions moves the workpiece 152, held by the workpiece holder 150 in a raster-like scanning motion through filtered GCIB 131 to cause a uniform (or otherwise programmed) irradiation of a surface of the workpiece 152 by the filtered GCIB 131 for processing of the workpiece 152. The workpiece holder 150 disposes the workpiece 152 at an angle with respect to the axis 129 of the filtered GCIB 131 so that the filtered GCIB 131 has an angle of beam incidence with respect to a workpiece 152 surface. The angle of beam incidence may be 90 degrees or some other angle, but is typically 90 degrees or near 90 degrees as shown in FIG. 1. During Y-scanning, the workpiece 152 and the workpiece holder 150 move from the position shown to the alternate position "A" indicated by the designators 152A and 150A respectively. Notice that in moving between the two positions, the workpiece 152 is scanned through the filtered GCIB 131 and in both extreme positions, is moved completely out of the path of the filtered GCIB 131 (over-scanned). Though not shown explicitly in FIG. 1, similar scanning and over-scan is performed in the (typically) orthogonal X-scan motion 208 direction (in and out of the plane of the paper).

A beam current sensor 218 is disposed beyond the workpiece holder 150 in the path of the filtered GCIB 131 so as to intercept a sample of the filtered GCIB 131 when the workpiece holder 150 is scanned out of the path of the filtered GCIB 131. The beam current sensor 218 is typically a Faraday cup or the like, closed except for a beam-entry opening, and is typically affixed to the wall of the vacuum vessel 102 with an electrically insulating mount 212.

A controller 220, which may be a microcomputer based controller, connects to the X-scan actuator 202 and the Y-scan actuator 204 through electrical cable 216 and controls the X-scan actuator 202 and the Y-scan actuator 204 so as to place the workpiece 152 into or out of the filtered GCIB 131 and to scan the workpiece 152 uniformly relative to the filtered GCIB 131 to achieve desired processing of the workpiece 152 by the filtered GCIB 131. Controller 220 receives the sampled beam current collected by the beam current sensor 218 by way of lead 214 and thereby monitors the GCIB and controls the GCIB dose received by the workpiece 152 by removing the workpiece 152 from the filtered GCIB 131 when a predetermined desired dose has been delivered.

Figure 3A:
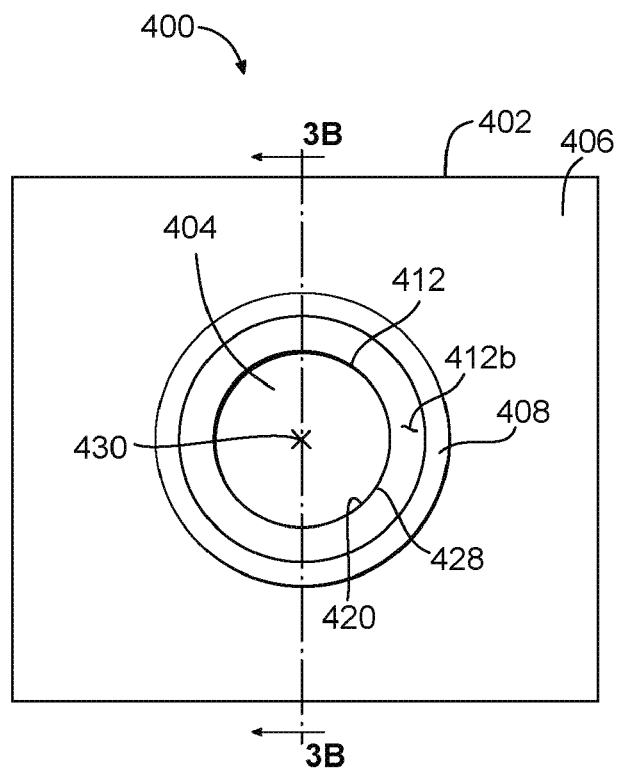
FIG. 3A is a front view of the GCIB beam-defining apparatus of FIG. 2.
Figure 3B:
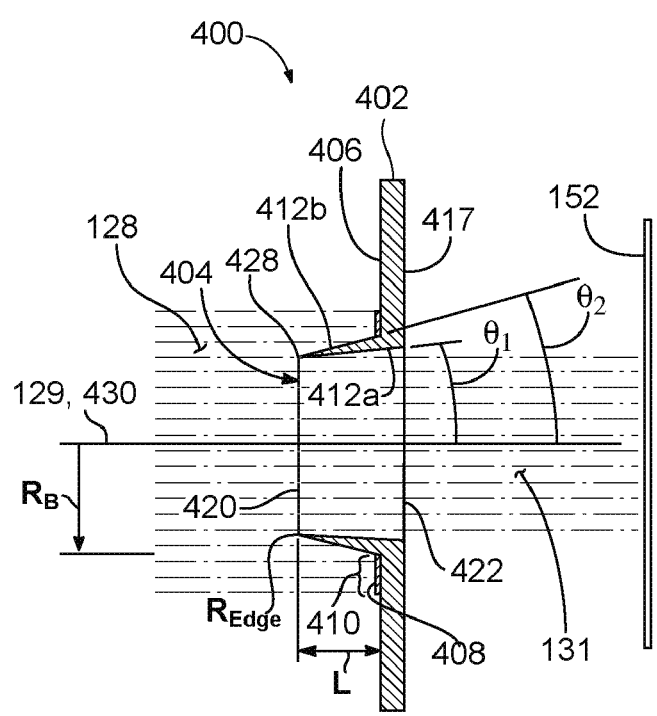
FIG. 3B is a cross-sectional view taken generally along line 3B-3B of FIG. 3A with the gas cluster ion beam depicted.

With reference to FIGS. 3A and 3B, the beam-defining apparatus 400 includes a tubular protrusion 412 that projects outwardly from a front surface 406 of the aperture plate 402 toward the GCIB upstream direction and in a direction facing away from the workpiece 152. The aperture 404, which is defined as a bore partially inside the protrusion 412 and partially inside aperture plate 402, collimates and shapes the GCIB 128 so that, after passing through the beam-defining apparatus 400, the filtered GCIB 131 impinges workpiece 152. The aperture 404 extends between an inlet opening 420 near the apex 428 of the protrusion 412 and an outlet opening 422 in the aperture plate 402 downstream of the inlet opening 420 in a direction toward workpiece 152. In use, the outlet opening 422 is positioned along a central axis 430 between the inlet opening 420 and the workpiece 152.

The protrusion 412 includes an outer surface 412b that intersects the front surface 406 of the aperture plate 402 at a corner. Likewise, the aperture plate 402 and protrusion 412 define an inner surface 412a that surrounds the aperture 404 and that intersects a rear surface 417 of the aperture plate 402 at another corner defined at the outlet opening 422. The inner and outer surfaces 412a, 412b converge and intersect at an apex 428, which is remote from the workpiece 152 and spaced from aperture plate 402a along central axis 430, at the apex 428 to define inlet opening 420 to the aperture 404.

The outlet opening 422 is typically larger in cross-sectional area than the inlet opening 420 to limit interactions between the GBIC 128 and the inner surface 412a. The protrusion 412 may be dimensioned such that the length, L, as shown in FIG. 3B, that the protrusion 412 projects from front surface 406 is greater than or equal to $R_B$. In an alternative embodiment, the front and rear surfaces 406, 417 of the aperture plate 402 may be non-planar, as opposed to the planar surfaces 406, 417 of the representative embodiment.

The GCIB 128 may be distributed symmetrically about axis 129 and, in particular, the GCIB 128 may be substantially cylindrical with a round cross-sectional profile from a perspective along the axis 129 and a beam radius, $R_B$, as best shown in FIG. 3B, measured radially from the axis 129. The aperture 404 and its openings 420, 422, as well as inner surface 412a, are aligned relative to the central axis 430 that, in the representative embodiment, is shown aligned substantially collinear with the axis 129 of the GCIB 128. Typically, the aperture 404 and its openings 420, 422, as well as inner surface 412a, has a concentric arrangement relative to the central axis 430. As understood by a person having ordinary skill in the art, the axes 129, 430 are not limited to being collinear but may merely be parallel or may be angularly inclined relative to each other.

Figure 1A:
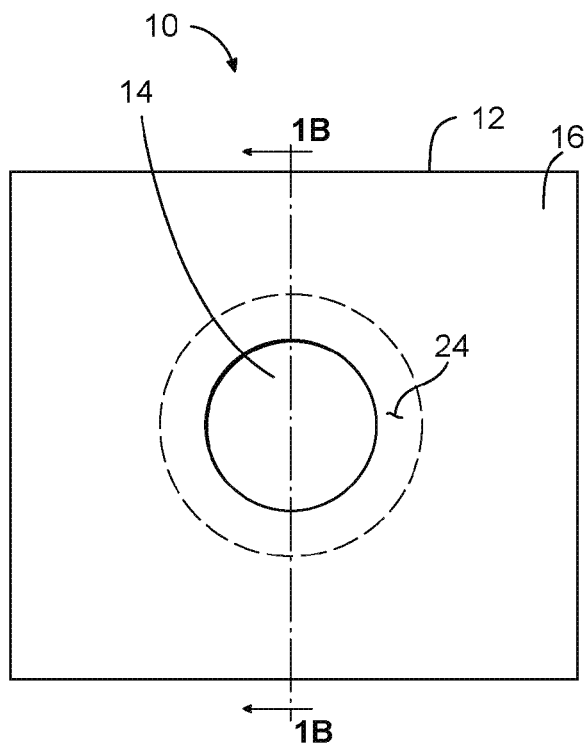
FIG. 1A is a front view of a conventional GCIB beam-defining apparatus for a GCIB processing apparatus.
Figure 1B:
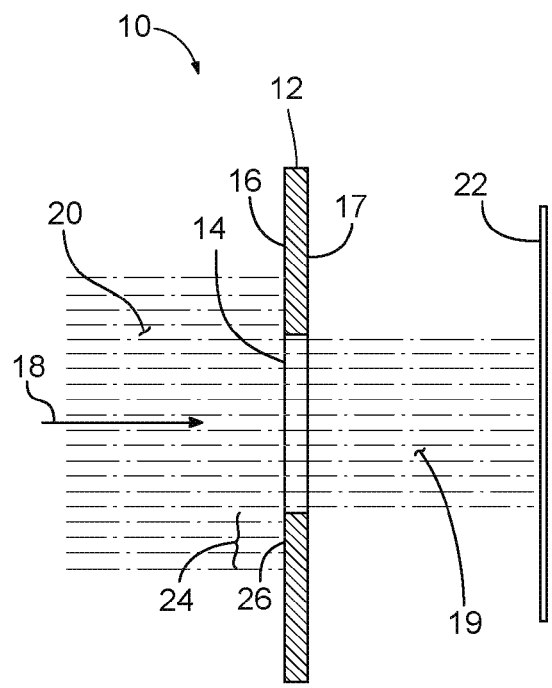
FIG. 1B is a cross-sectional view taken generally along line 1B-1B of FIG. 1A.

A portion of the GCIB 128 is intercepted by the outer surface 412b of protrusion 412 and another portion by an annular region 410 on the front surface 406 of the aperture plate 402, although the latter impingement is contingent upon value of the beam radius, $R_B$, and the spatially relationship between the axes 129, 430. Typically, the axes 129, 430 are approximately collinear, which is assumed for purposes of description. The portion of the GCIB 128 that impinges the outer surface 412b of protrusion 412 impacts at a glancing angle (i.e., an acute angle) rather than at an approximately normal angle (i.e., 90°), as occurs in conventional beam-defining apparatus when the GCIB impinges the aperture plate 12 (FIGS. 1A, 1B). Because of the glancing incidence, the sputtering rate of the constituent material of the outer surface 412b and deposition of the sputtered material on the outer surface 412b is lower than the sputtering rate if the angle of incidence of the GCIB was normal to the surface, as in conventional beam-defining apparatus.

Furthermore, material removed from the outer surface 412b by sputtering or etching tends to redeposit at a roughly annular region 410 on the front surface 406 but remote from the inlet opening 420 to aperture 404. After prolonged use, and as a result of sputtering, etching, and/or deposition, contaminants 408 accumulate on the annular region 410 on the front surface 406. Eventually some of the contaminants 408 are shed from the front surface 406 in the form of particles but, in this instance, are not efficiently transported to the workpiece 152 because, at least in part, of the remoteness of the annular region 410 from the inlet opening 420 to aperture 404 and, possibly, because at least in part of the shielding of the shed particles from electrostatic, and other, beam forces provided by the protrusion 412.

In the representative embodiment, the inner and outer surfaces 412a, 412b of the protrusion 412 are conical or frustoconical so that the inner and outer surfaces 412a, 412b taper in an upstream direction toward opening 420. The angle, θ1, formed by the conical outer surface 412b with the central axis 430 may be less than or equal to about 45° and greater than about 0°. The angle, $θ_2$, formed by the inner conical surface 412a with the central axis 430 is greater than 0° and, in specific embodiments, may be about 3° or more. In another embodiment, the edge radius, $R_{Edge}$, may be a sharp edge having a radius of less than about 1 millimeter.

Figure 4:
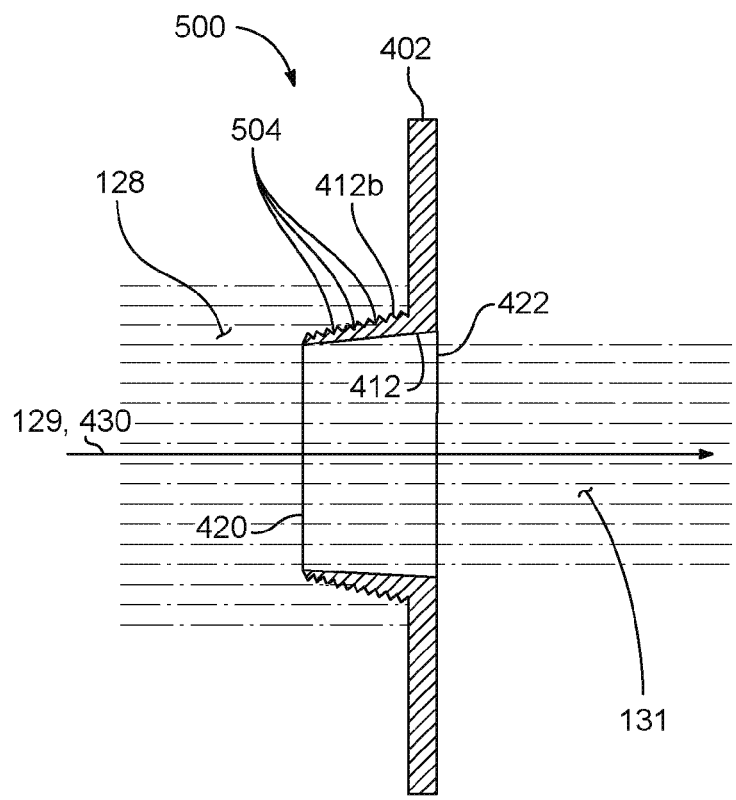
FIG. 4 is a cross-sectional view similar to FIG. 3B of a GCIB beam-defining apparatus in accordance with an alternative embodiment of the invention.

With reference to FIG. 4 in which like reference numerals refer to like features in FIGS. 3A, 3B and in accordance with an alternative embodiment, the protrusion 412 of a beam-defining apparatus 500 includes serrations 504 on the outer surface 412b. The serrations 504 comprise a series of concentric ridges extending about the circumference of the protrusion 412 and encircling the aperture 404 of the beam-defining apparatus 500. For gas cluster ion beams characterized by a low sputtering rate when incident normal to a surface, the serrations 504 may have benefits in comparison with a smooth outer surface 412b of the protrusion 412 (FIG. 3B). An additional benefit of this profile is that the serrations 504 may interfere with gravity transport of shed particles toward the inlet opening 420 of the aperture 404.

Figure 5:
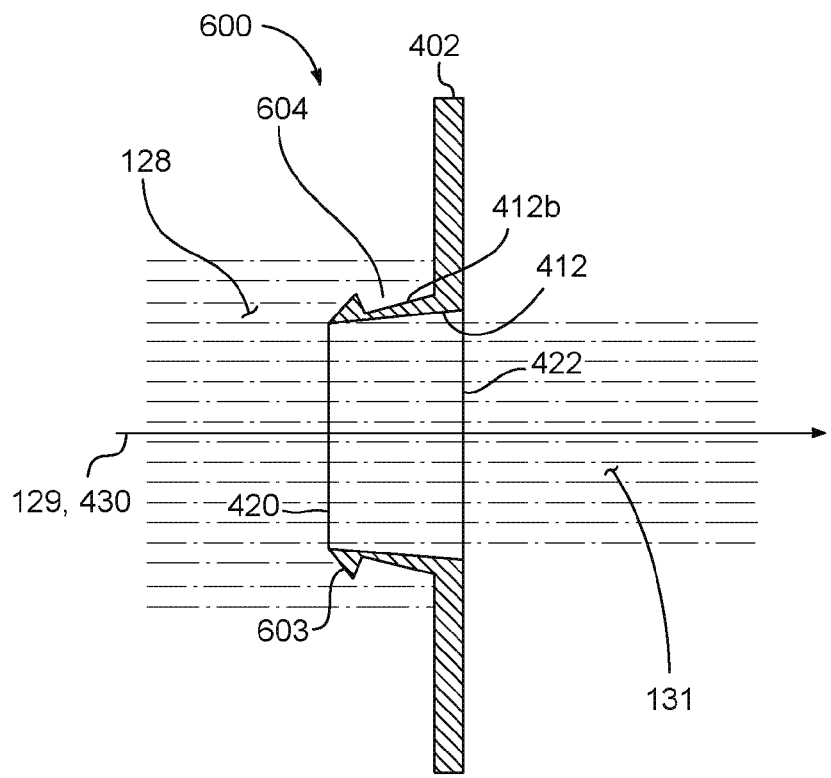
FIG. 5 is a cross-sectional view similar to FIGS. 3B and 4 of a GCIB beam-defining apparatus in accordance with an alternative embodiment of the invention.

With reference to FIG. 5 in which like reference numerals refer to like features in FIGS. 3A, 3B, and 4 and in accordance with an alternative embodiment, the protrusion 412 of a beam-defining apparatus 600 includes a feature 603 projecting from the outer surface 412b. The feature 603, which extends about the circumference of the protrusion 412 and encircles the aperture 404, projects from the outer surface 412b to define a circular pocket or indentation 604 generally between the outer surface 412b and a surface of the feature 603 that is shadowed from the GCIB 128. The feature 603 and circular indentation 604 may serve to collect particles shed from the conical outer surface 412b that may tend to transport by gravity or other forces toward the inlet opening 420 of aperture 404. Such particles are caught in the circular indentation 604, where they are shielded from the influence of the GCIB 128. The feature 603 may be continuous and unbroken. In the representative embodiment, the feature 603 is located closer to the inlet opening 420 than to the aperture plate 402 and outlet opening 422.

Figure 6:
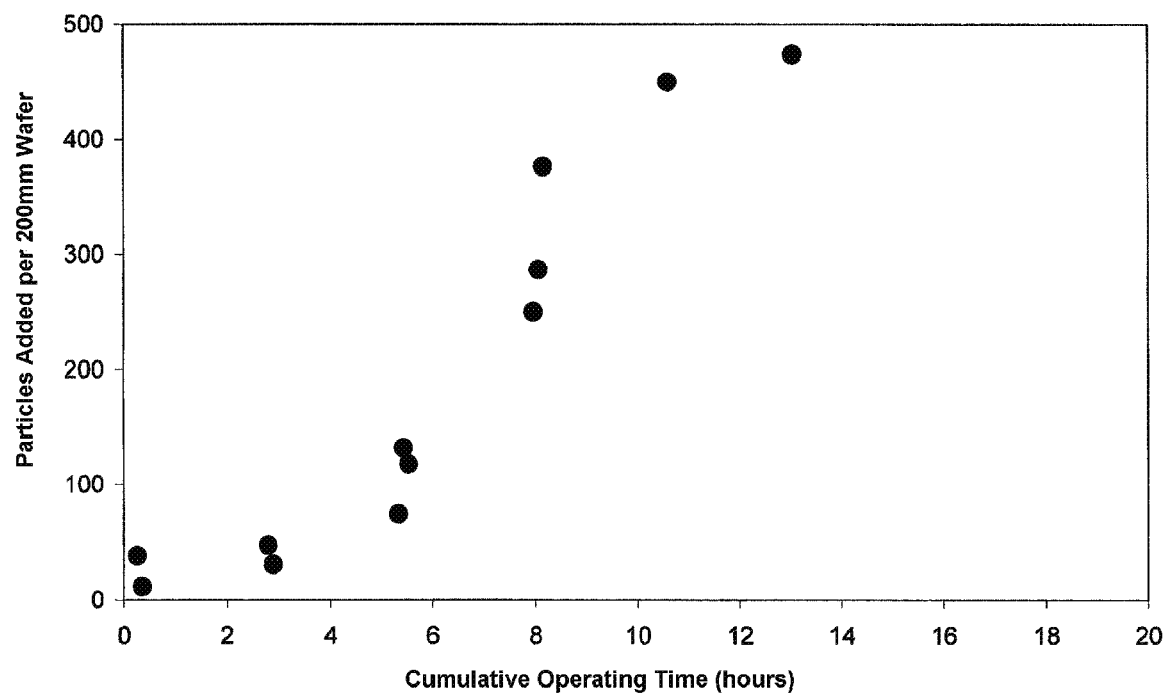
FIG. 6 is a graph showing particle contamination performance of a GCIB processing apparatus with a conventional beam-defining apparatus as shown in FIGS. 1A and 1B.

FIG. 6 is a graph illustrating the particle contamination performance of a GCIB processing apparatus incorporating a conventional beam-defining apparatus, substantially as shown in FIGS. 1A and 1B, that includes a flat aperture plate with a conventional round, planar aperture. The GCIB processing apparatus was configured for processing clean 200 mm diameter silicon wafers for semiconductor applications. Numerous wafers were processed by irradiating them with a gas cluster ion beam composed from a $B_2H_6$ source gas, accelerated with a 5 kV accelerating potential.

Particles of size greater than 0.16-micron diameter were measured on the wafers both before, and after, GCIB processing with a dose of $1 \times 10^{15}$ gas cluster ions per $cm^2$. The number of particles added to the wafer by the GCIB process was calculated for each wafer and plotted in FIG. 6 as a function of total operating time of the GCIB processing apparatus. The plotted data in FIG. 6 shows that, when processed with a beam-defining apparatus including a conventional aperture, particulate contamination rates on the processed wafers started out at a low level of about thirty (30) particles added per wafer. However, with cumulative operating time, contamination rates grew rapidly (in about ten (10) hours) to very high levels of more than 400 particles added per wafer.

Figure 7:
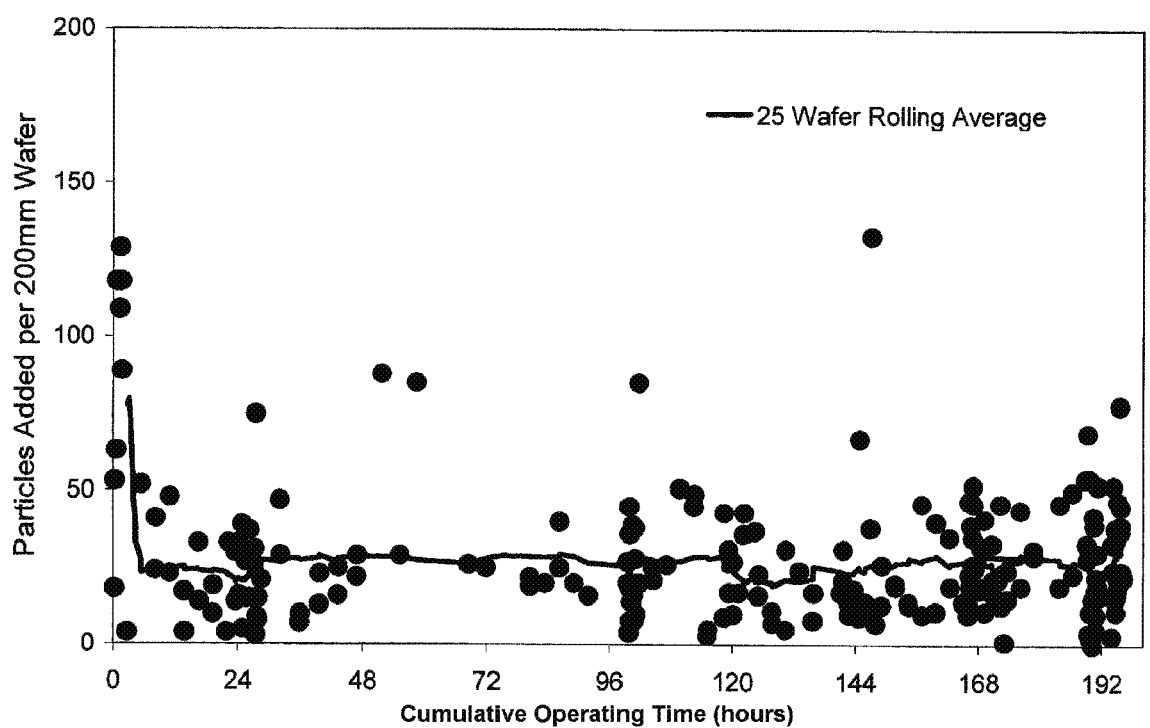
FIG. 7 is a graph showing improved particle contamination performance of the GCIB beam-defining apparatus of FIGS. 3A, and 3B.

FIG. 7 is a graph showing improved particle contamination performance of a GCIB processing apparatus outfitted an improved beam-defining apparatus substantially as shown in FIGS. 3A and 3B. The GCIB processing apparatus was again configured for processing clean 200 mm diameter silicon wafers for semiconductor applications. Numerous wafers were processed using the same processing conditions as used for FIG. 6 by irradiating them with a gas cluster ion beam composed from a $B_2H_6$ source gas and accelerated with a 5 kV accelerating potential. Particles of size greater than 0.16-micron diameter were measured on the wafers both before, and after, GCIB processing with a dose of $1\times10^{15}$ gas cluster ions per $cm^2$. The number of particles added to the wafer by the GCIB process was calculated for each wafer and plotted as a function of total operating time of the GCIB processing apparatus. A twenty-five (25) wafer rolling average was also plotted on the graph.

As is apparent from the data in FIG. 7, the improved beam-defining aperture reduced the observed particulate accumulation. Particulate contamination rates on the processed wafers were observed to remain at a low average contamination rate of about twenty-five (25) particles added per wafer. The particulate contamination rates did not increase with cumulative operating time up to at least 192 hours, which represents a substantial improvement over the behavior observed for a beam-defining apparatus having a conventional aperture.

The various embodiments of the beam-defining apparatus feature an improved beam aperture geometry that increases the distance over which contaminants must be transported to the aperture so as to be transported to, and thereby contaminate, the workpiece. The improved beam aperture geometry presents an increased surface area impinged by the GCIB that causes contamination to accumulate at a lower development rate on the surfaces bounding the aperture than observed in conventional beam-defining apparatus. The improved beam aperture geometry shields particles of contamination shed by the beam-defining apparatus from beam-induced electrostatic transport effects that would, if not mitigated, potentially transfer particles from the beam-defining apparatus to the workpiece.

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. For example, the aperture may have a cross-sectional geometrical shape that is not round, but is instead rectangular, slit-shaped, elliptical, and another non-round aperture shape. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A beam-defining apparatus for defining a gas cluster ion beam used to process a workpiece, the beam-defining apparatus comprising:
    a first member adapted to be supported in a spaced relationship with the workpiece; and
    a second member projecting from the first member in a direction away from the workpiece,
    wherein the first and second members include an aperture configured to transmit at least a portion of the gas cluster ion beam to the workpiece, the aperture is aligned about a central axis, and the aperture includes an inlet opening in the second member that is spaced along the central axis from the first member and an outlet opening in the first member proximate to the workpiece.

2. The beam-defining apparatus of claim 1 wherein the second member includes an outer surface that intersects the first member and an inner surface that surrounds the aperture, the inner surface and the outer surface converging at the inlet opening to define an apex.

3. The beam-defining apparatus of claim 2 wherein the apex is a sharp edge having a radius of less than about 1 millimeter.

4. The beam-defining apparatus of claim 2 wherein the outer surface is inclined toward the apex at a first angle relative to the central axis that is less than 90° and greater than about 0° so that the beam-defining apparatus can be positioned relative to the gas cluster ion beam with the gas cluster ion beam impinging the outer surface at a non-normal angle of incidence.

5. The beam-defining apparatus of claim 4 wherein the first angle is less than or equal to about 45° and greater than about 0°.

6. The beam-defining apparatus of claim 4 wherein the inner surface is inclined toward the apex at a second angle relative to the central axis that is greater than 0° so that the outlet opening has a greater cross-sectional area viewed along the central axis than the inlet opening.

7. The beam-defining apparatus of claim 1 wherein the aperture is aligned about a central axis, and the aperture includes an inlet opening in the second member that is spaced along the central axis from the first member and an outlet opening in the first member proximate to the workpiece, and the second member includes an outer surface that intersects the first member and an inner surface that surrounds the aperture, the inner surface and the outer surface converging at the inlet opening to define an apex, the outer surface being inclined toward the apex at an acute angle relative to the central axis so that the beam-defining apparatus can be positioned relative to the gas cluster ion beam with the gas cluster ion beam impinging the outer surface at a non-normal angle of incidence.

8. The beam-defining apparatus of claim 1 wherein the second member includes an outer surface that intersects the first member, an inner surface that surrounds the aperture, and an apex joining the inner surface and the outer surface at an apex to define an inlet opening to the aperture, the apex spaced from the first member by a distance that is greater than or equal to a beam radius of the gas cluster ion beam.

9. The beam-defining apparatus of claim 1 wherein the aperture is aligned about a central axis, and the second member includes an outer surface that intersects the first member and an inner surface that surrounds the aperture, and further comprising:
    a plurality of serrations extending circumferentially about the outer surface, the serrations spaced apart along the central axis.

10. The beam-defining apparatus of claim 1 wherein the second member includes an outer surface that intersects the first member and an inner surface that surrounds the aperture, and further comprising:
    a feature projecting from the outer surface, the feature extending circumferentially about the outer surface to define an indentation bordered by a portion of the feature and the outer surface.

11. The beam-defining apparatus of claim 10 wherein the feature is continuous and unbroken.

12. The beam-defining apparatus of claim 10 wherein the inner surface and the outer surface intersect at an apex remote from the first member to define an inlet opening to the aperture, and the feature is located closer to the inlet opening than to the first member.

13. The beam-defining apparatus of claim 10 wherein the aperture is aligned about a central axis, and the aperture includes an inlet opening in the second member that is spaced along the central axis from the first member and an outlet opening in the first member proximate to the workpiece, and the feature is located closer to the inlet opening than to the outlet opening.

14. A gas cluster ion beam apparatus for processing a workpiece with a gas cluster ion beam, the gas cluster ion beam apparatus comprising:
   a vacuum vessel;
   a gas cluster ion beam source within the vacuum vessel, the gas cluster ion beam source configured to produce the gas cluster ion beam; and
   a beam-defining apparatus disposed in the vacuum vessel between the gas cluster ion beam source and the workpiece, the beam-defining apparatus including a first member adapted to be supported in a spaced relationship with the workpiece and a second member projecting from the first member in a direction away from the workpiece, the first and second members including an aperture configured to transmit at least a portion of the gas cluster ion beam to the workpiece, the second member including an inner surface that surrounds the aperture, an outer surface that intersects the first member, and a feature projecting from the outer surface, and the feature extending circumferentially about the outer surface to define an indentation bordered by a portion of the feature and the outer surface.

15. A method of processing a workpiece with a gas cluster ion beam, the method comprising:
   directing the gas cluster ion beam through an inlet opening to a beam-defining aperture;
   orienting a surface surrounding the beam-defining aperture relative to a travel direction of the gas cluster ion beam so that the surface is inclined relative to the travel direction;
   impinging the surface with the gas cluster ion beam to reduce a cross-sectional area of the gas cluster ion beam transmitted through the beam-defining aperture;
   exposing the workpiece to the gas cluster ion beam after the gas cluster ion beam exits an outlet opening of the beam-defining aperture; and
   collecting a particulate, which delaminates from contamination formed by the impingement of the surface with the gas cluster ion beam, with a feature that projects from the surface.

16. The method of claim 15 wherein orienting the surface surrounding the beam-defining aperture relative to the travel direction of the gas cluster ion beam further comprises:
   positioning the beam-defining aperture relative to the gas cluster ion beam such that the beam-defining aperture and gas cluster ion beam are substantially co-axial.

17. The method of claim 15 wherein collecting the particulates further comprises:
   retaining the particulate such that the particulate is prevented from reaching the inlet opening to the aperture.

18. The method of claim 15 wherein orienting the surface surrounding the beam-defining aperture relative to the travel direction of the gas cluster ion beam further comprises:
   orienting the surface such that the surface is inclined at an acute angle relative to the travel direction of the ion beam.

19. A beam-defining apparatus for defining a gas cluster ion beam used to process a workpiece, the beam-defining apparatus comprising:
   a first member adapted to be supported in a spaced relationship with the workpiece;
   a second member projecting from the first member in a direction away from the workpiece, the first and second members including an aperture aligned about a central axis and configured to transmit at least a portion of the gas cluster ion beam to the workpiece, and the second member including an inner surface that surrounds the aperture and an outer surface that intersects the first member; and
   a plurality of serrations extending circumferentially about the outer surface of the second member, the serrations spaced apart along the central axis.

20. A beam-defining apparatus for defining a gas cluster ion beam used to process a workpiece, the beam-defining apparatus comprising:
   a first member adapted to be supported in a spaced relationship with the workpiece;
   a second member projecting from the first member in a direction away from the workpiece, the first and second members including an aperture configured to transmit at least a portion of the gas cluster ion beam to the workpiece, and the second member including an inner surface that surrounds the aperture and an outer surface that intersects the first member; and
   a feature projecting from the outer surface, the feature extending circumferentially about the outer surface to define an indentation bordered by a portion of the feature and the outer surface.

21. The beam-defining apparatus of claim 20 wherein the feature is continuous and unbroken.

22. The beam-defining apparatus of claim 20 wherein the inner surface and the outer surface intersect at an apex remote from the first member to define an inlet opening to the aperture, and the feature is located closer to the inlet opening than to the first member.

23. The beam-defining apparatus of claim 20 wherein the aperture is aligned about a central axis, and the aperture includes an inlet opening in the second member that is spaced along the central axis from the first member and an outlet opening in the first member proximate to the workpiece, and the feature is located closer to the inlet opening than to the outlet opening.

* * * * *